(12) United States Patent
Aoike et al.

(10) Patent No.: US 6,195,263 B1
(45) Date of Patent: Feb. 27, 2001

(54) ELECTRONIC CONTROL UNIT

(75) Inventors: Koji Aoike; Naotaka Murakami; Hiroki Takata; Osamu Yamato, all of Anjo (JP)

(73) Assignee: Aisin AW Co., Ltd. (JP)

( * ) Notice: Subject to any disclaimer, the term of this patent is extended or adjusted under 35 U.S.C. 154(b) by 0 days.

(21) Appl. No.: 09/271,167

(22) Filed: Mar. 18, 1999

(30) Foreign Application Priority Data

Mar. 20, 1998 (JP) .................................................. 10-092336

(51) Int. Cl.[7] .............................. H05K 7/00; H01R 9/00
(52) U.S. Cl. ...................... 361/752; 361/801; 439/62; 439/949; 29/856
(58) Field of Search ...................................... 361/752, 753, 361/760, 767, 796, 801, 803, 813; 439/62, 76.1, 86, 949, 954; 174/50; 29/856

(56) References Cited

U.S. PATENT DOCUMENTS 5,185,550 * 2/1993 Morita et al. ......................... 310/344
5,646,445 * 7/1997 Masumoto et al. ................... 257/723

FOREIGN PATENT DOCUMENTS

| 2-146839 | 12/1990 | (JP) . |
| 5-053149 | 7/1993 | (JP) . |
| 6-104362 | 4/1994 | (JP) . |
| 7-010947 | 2/1995 | (JP) . |
| 10-270134 | * 10/1998 | (JP) . |

* cited by examiner

Primary Examiner—Jayprakash N. Gandhi
(74) Attorney, Agent, or Firm—Lorusso & Loud

(57) ABSTRACT

In an electronic control unit, a pad portion thereof is firmly fixed to a terminal plate and vibration of the terminal plate under supersonic vibration is prevented so as to secure the bonding strength between the terminal plate and the wire during wire bonding. One lead portion of each terminal plate is connected to a pin of the connector and another lead portion is wire bonded to the terminal of the circuit substrate. The leads have bent portions extending from an exposed surface to be bonded in opposite directions to be embedded in the pad portion of the case such that the lead portion of the terminal plate is firmly fixed to the case.

6 Claims, 5 Drawing Sheets

ELECTRONIC CONTROL UNIT

The entire disclosure of Japanese Patent Application No. Hei 10-92336 filed on Mar. 20, 1998 including the specification, drawings and abstract is incorporated herein by reference in its entirety.

BACKGROUND OF THE INVENTION

1. Field of the Invention

The invention relates to an electronic control unit and more particularly, to the structure of a pad portion for connecting a connector and a circuit substrate of the electronic control unit by wire bonding.

2. Description of the Related Art

Hitherto, a circuit substrate constituting an electronic control unit is generally contained in a resin case (b) which is formed integrally with a connector (a) as shown in FIG. 8, and the circuit substrate (c) is electrically coupled to the connector (a) through a number of strip-like terminal plates (e) which have been molded integrally with the resin case (b) by die molding. Each of the terminal plates (e) has one end formed as a pin projecting into the connector (a) and the other end formed as a lead portion (f) having a face exposed at the pad portion (d) which is formed in the case (b). The lead portions (f) which are arrayed close together on a common plane in the pad portion (d) are designed to terminate at the front face of the pad portion (d).

The terminals at the side of the circuit substrate (c) are respectively connected to the lead portions (f) at the side of the terminal plate (e) by wire bonding which has been increasingly employed because of easy processing. Wire bonding is a method for bonding metals by compressing and vibrating an end of the bonding wire (g) formed of aluminum or the like to the lead portion (f) of the terminal plate e), with a bonding tool and using high frequency vibration, so as to remove soil or oxide film from the press fit portion.

Referring to FIG. 9, the lead portion (f) of the terminal plate (e) is fixed within the resin molding (case b) with its upper surface exposed to allow bonding to the wire (g) and has a thin embedded thickness. Therefore it is difficult to provide sufficient strength in the bond between the case (b) and the pad portion (d). More importantly, because the tip of the lead portion (f) terminates at the front face of the pad portion (d), in a so-called open state, sufficient force to arrest the movement of the terminal plate (e) cannot be obtained.

As described above, in the related art, the terminal plate (e) is held in place merely at a short portion of its length where it passes through the wall of the case (b). Accordingly, if the wire (g) is pressed against the lead portion (f) in the pad portion (d), using the bonding tool to apply vibration for effecting the wire bonding, the lead portion (f) which is insufficiently fixed is also vibrated together with the wire g), thus inhibiting formation of a good bond between the wire (g) and the lead portion (f).

SUMMARY OF THE INVENTION

Accordingly, it is a first object of the invention to provide a bond between a circuit substrate and a connector in an electronic control unit which is sufficiently strong to withstand the supersonic vibration applied in wire bonding.

Further, even if sufficient bonding strength is provided to satisfy the foregoing objective, because the wire (g) is pulled upward by the bonding tool upon completion of the bonding, the lead portion (f) of the terminal plate (e) is likely to separate from the pad portion (d), resulting in displacement. Therefore, it is a second object of the present invention to prevent the lead portion (f) from separating from the pad portion (d).

Further, in manufacture of such a connector having a large number of closely arrayed terminal plates (e) arrayed directly on the case (b), it is necessary to spread the resin completely to reach even fine gaps. For this purpose, the resin is required to be compressed at a high pressure, and it becomes difficult to prevent the displacement of the terminal plates (e) when molding under high pressure. Therefore, a two-stage manufacture must be used to avoid the problem. The two-stage manufacture includes a first stage wherein only the portion in the area of the terminal plate (e) is molded (primary molded part) to a degree allowing relative positioning, and a second stage wherein the primary molded part is further molded to the case for completing the whole case. However, in practice of the two-stage molding process, a fine gap between the primary molded part and the secondary molded part is formed owing to thermal shrinkage after completion. Especially, slip may occur at the boundary between the secondary molded part and back surface of the pad portion with a gap forming between one end side of the pad portion and the secondary molded part, resulting in the possibility of buffering the supersonic vibration used in wire bonding. Such buffering of the vibration may cause deterioration of the bonding strength between the lead in the pad portion and the wire.

Accordingly, it is a third object of the present invention to prevent buffering of the supersonic vibration used in wire bonding.

In order to attain the first object, the present invention provides an electronic control unit including a circuit substrate, a case accommodating the circuit substrate, a connector provided on the case, and a number of terminal plates extending into the case from the pins of the connector to be connected to the circuit substrate. The case is provided with a pad portion for securing therein lead portions of the terminal plates. A surface of each of the lead portions is exposed in the pad portion and is connected at this exposed surface to a terminal on the circuit substrate through a bonding wire.

To better attain the aforementioned second object, each lead portion is bent at the opposing ends of the exposed surface portion for embedding in the case.

In order to attain the aforementioned third object, the case is formed of a primary molded part formed by integrally molding the connector and the pad portion and a secondary molded part. More specifically, a resistance or "anchor" portion in mesh with the secondary molded part is formed on the back surface of a pad portion of the primary molded part.

According to one preferred embodiment of the invention, each lead portion has first bent portions extending in opposite directions from its surface section which is exposed in the pad portion, which bent portions are embedded in the case whereby the lead portion of the terminal plate is completely fixed to the case at the pad portion. Moreover, as the bent portions serve to prevent the wire and lead portion from vibrating together during wire bonding, strong bonding therebetween can be attained.

Furthermore, the lead portion may be more firmly fixed to the pad portion through second bent portions formed by further bending the aforementioned first bent portions. In this manner the lead portion can be more firmly fixed to the pad portion of the case, not only in the axially extending direction thereof but also in a direction perpendicular thereto. As a result, the lead portion cannot separate from the pad portion when lifting away the bonding tool.

Furthermore, because an anchor portion is meshed with the secondary molded part and is provided on the back surface of the pad portion of the primary molded part, it prevents release of the vibration at the open end side of the pad portion, thus ensuring good strength in the bond between the leads embedded in the pad portion and the wires during wire bonding.

DESCRIPTION OF THE PREFERRED EMBODIMENTS

Figure 1:
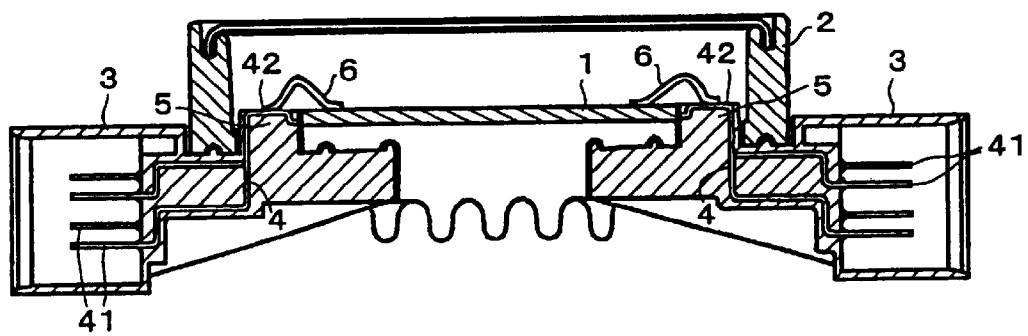
FIG. 1 is a sectional view of a electronic control unit according to an embodiment of the invention.

Referring to the drawings, an embodiment of the invention will now be described.

Figure 2:
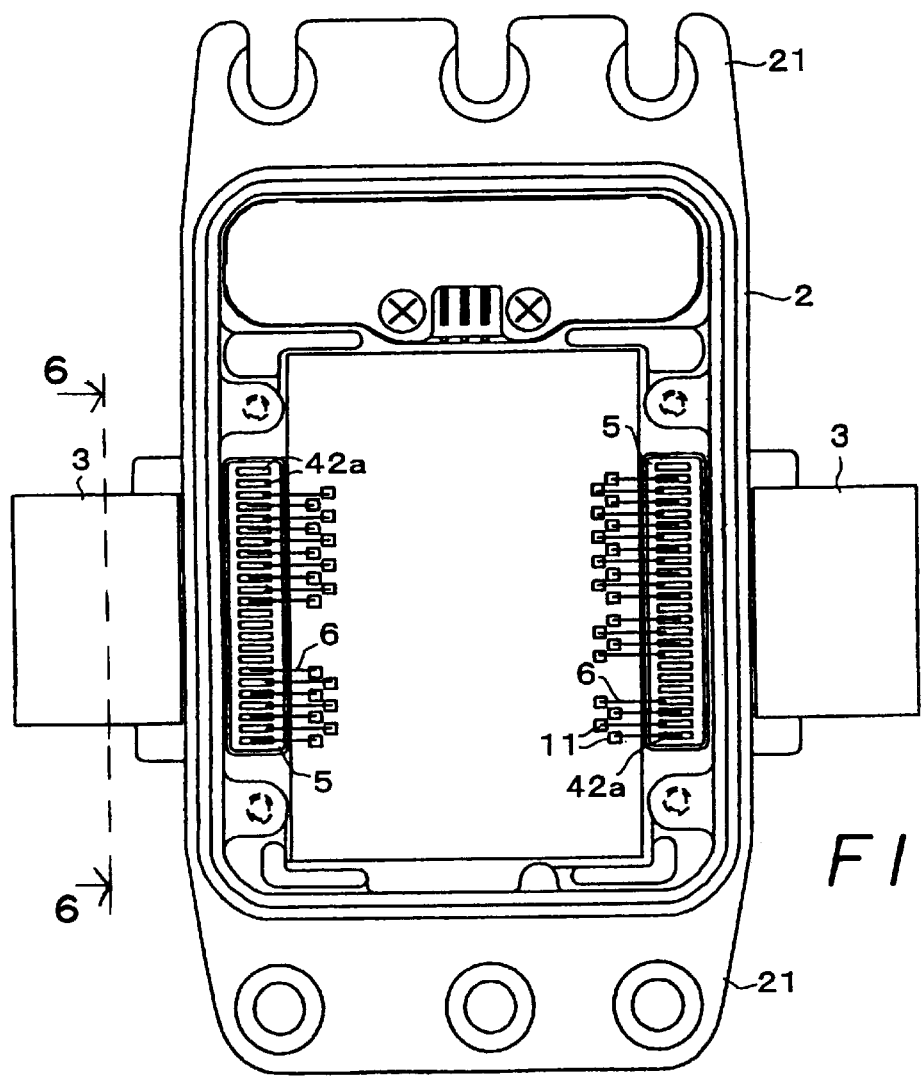
FIG. 2 is a plan view of the electronic control unit of FIG. 1 with its cover removed.

As shown in FIGS. 1 and 2, an electronic control unit is formed of a circuit substrate 1, a case 2 housing the circuit substrate 1, connectors 3 mounted on the case 2, and a number of terminal plates 4 inserted into the case 2 and extending therefrom in the form of pins 41 in a connector 3. The case 2 is provided with a pad portion 5 for holding embedded therein lead portions 42 of the terminal plates 4. An exposed surface 42a of each lead portion 42 in the pad portion 5 is bonded to a terminal 11 at the side of the circuit substrate 1 through a bonding wire 6.

Figure 3:
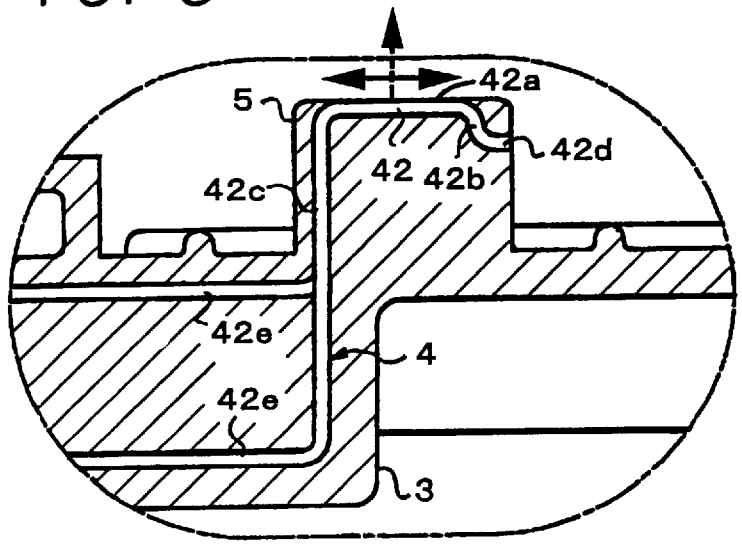
FIG. 3 is an enlarged, partial sectional view of the pad portion of the electronic control unit of FIG. 1.

The enlarged sectional view of the pad portion shown in FIG. 3, shows that each of the lead portions 42 of the terminal plates 4 has bent portions 42b, 42c extending in opposite directions from the exposed surface 42a in the pad portion 5, which bent portions are embedded in the insulating resin of the case 2. Also, each lead portion 42 further has second bent portions 42d, 42e extending from the bent portions 42b, 42c, respectively.

More specifically, referring to FIGS. 1 and 2, the circuit substrate 1 constitutes an electronic control circuit of a microcomputer having various circuit elements on a ceramic substrate, on which a conductor in the form of a circuit pattern (not shown) is printed. As shown in FIG. 2, a large number of terminals 11 are arranged on opposing sides of the circuit substrate 1 to receive/send various signals and perform circuit operations.

The case 2 housing the circuit substrate 1 is substantially a box having a pair of flanges 21 extending from opposing ends thereof and connectors 3 extending from opposing sides. The flanges allow the case 2 to be fixed to an appropriate position on a vehicle. As further shown in FIG. 2, the pad portion 5 is integrated with the connector 3 and is located adjacent the array of the terminals 11 of the circuit substrate 1 so as to minimize the distance therebetween.

Figure 6:
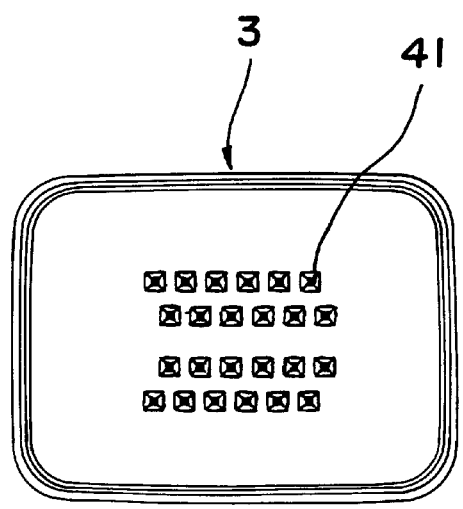
FIG. 6 is a sectional view taken along line 6—6 in FIG. 2.
Figure 7C:
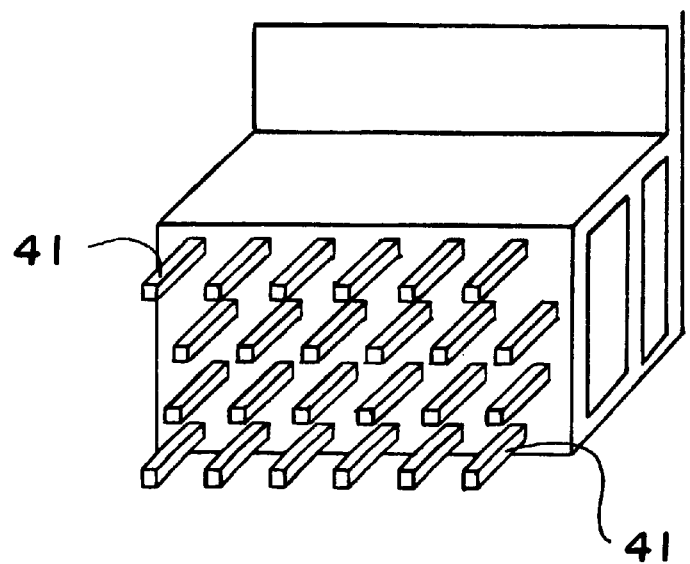
FIG. 7C is a schematic view of the pin array of the connector of FIG. 4.

Referring to FIG. 1, a large number of terminal plates 4 are embedded in the connector 3 by molding. 24 of these terminal plates 4 are formed as lead terminals laterally aligned in a row in a common plane defined by the upper surface of the pad portion 5. These terminal plates 4 extend to form pins arrayed in four rows of six pins each extending into the socket of the connector 3 (see FIGS. 6 and 7C). As shown in FIG. 3, the terminal plate 4 is bent at one end of its exposed surface 42a at a substantially right angle therewith to form a bent portion 42b embedded in the resin material of the pad portion 5. The tip of the bent portion 42b is further bent to form a second bent portion 42d extending in a substantially horizontal direction which is likewise embedded in the resin material of the pad portion 5. The tip of the second bent portion 42d terminates at the front face of the pad portion 5. Each terminal plate 4 is also bent at the other end of the exposed surface 42a at substantially right angle therewith to form a bent portion 42c embedded in the resin material of the pad portion 5. Each bent portion 42c is further bent to form one of two types of substantially horizontal second bent portions 42e extending in a substantially horizontal direction at different depths. The respective bent portions 42e are extended to form pins two-dimensionally arrayed in four rows of six pins each projecting into the socket of the connector 3.

With the structure of the pad portion 5 shown in FIG. 3, the wire pressed against the exposed surface 42a of the lead portion 42 undergoes high frequency vibration in the direction shown by the solid line arrow. The resultant forces do not displace the lead portions 42 because bent portions 42b, 42c connected to the pad portion 5 and connector 3, are embedded in the resin of the case 2. The perpendicular force on the wire upon completion of bonding acts is in the direction shown by the broken line arrow in the drawing. The displacement of the lead portion 42 in this perpendicular direction is likewise prevented by bent portions 42d, 42e which transmit the applied forces through the pad portion 5 and connector 3 to the case 2.

Figure 4:
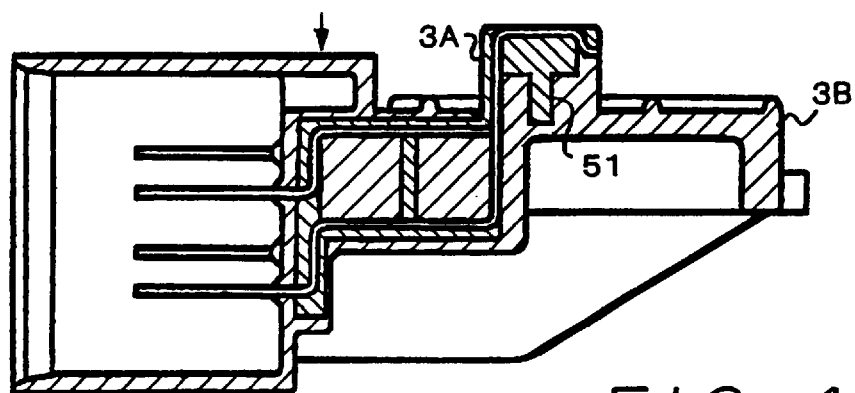
FIG. 4 is an axial sectional view of a connector of the electronic control device of FIG. 1.
Figure 5:
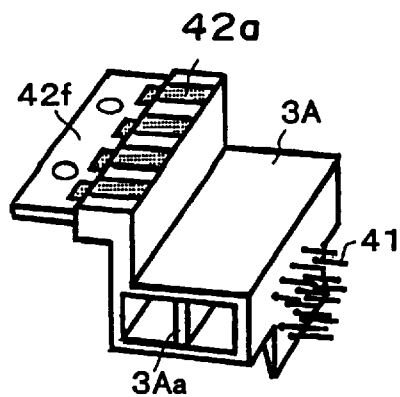
FIG. 5 is a perspective view schematically showing the configuration of the primary molded portion of the connector of FIG. 4.
Figures 7A, 7B:
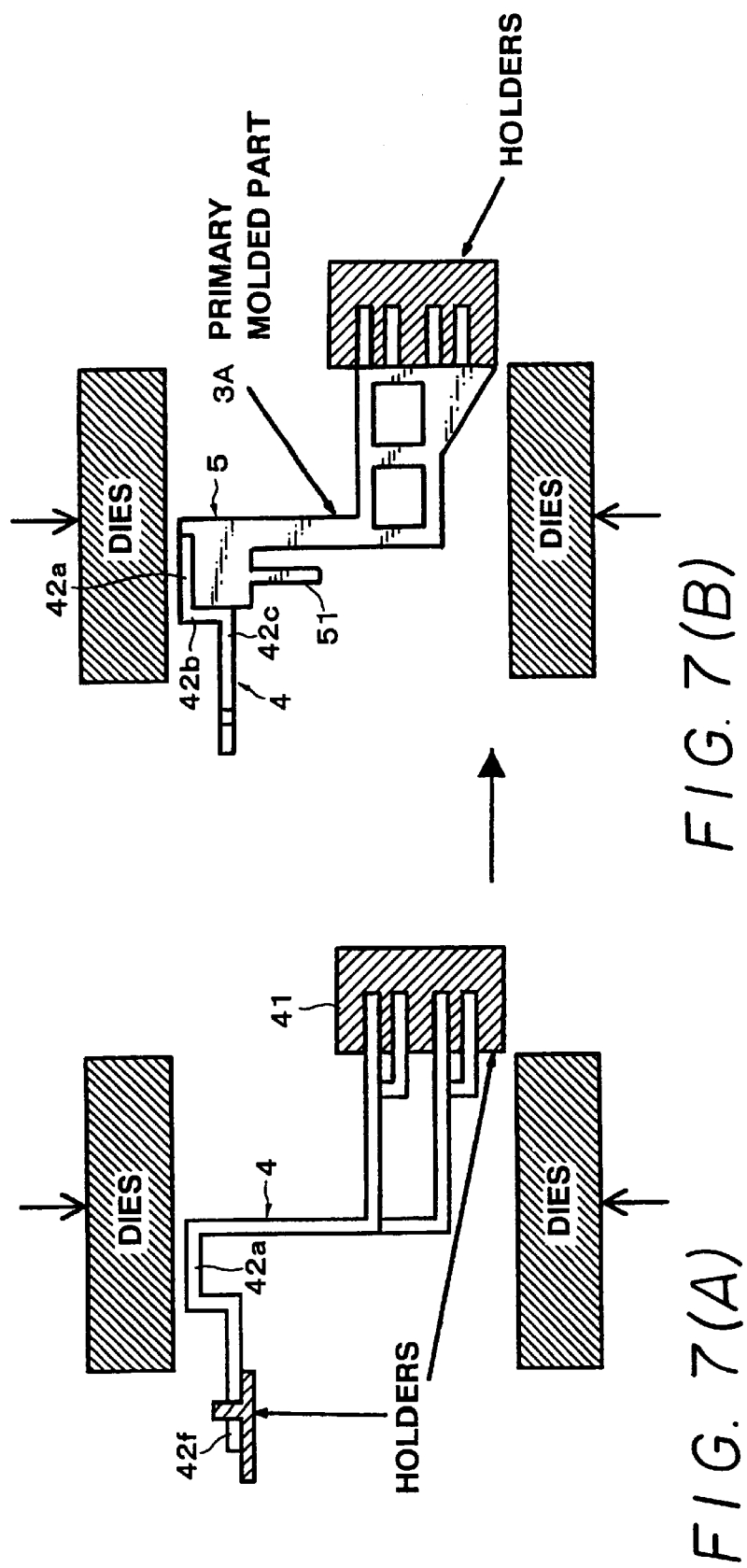
FIGS. 7A and 7B are schematic views illustrating the process for molding the connector of FIG. 4.
Figure 8:
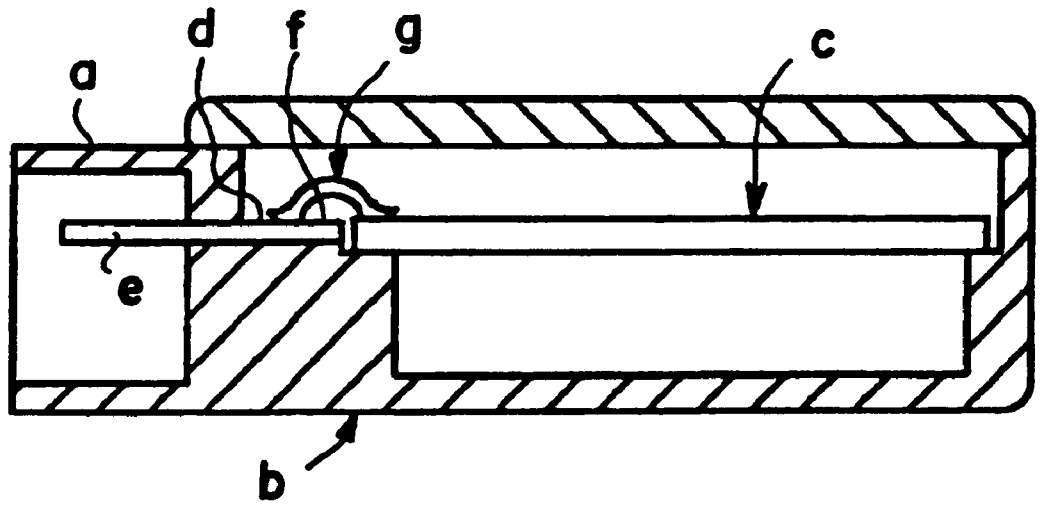
FIG. 8 is a sectional view of a conventional control unit.
Figure 9:
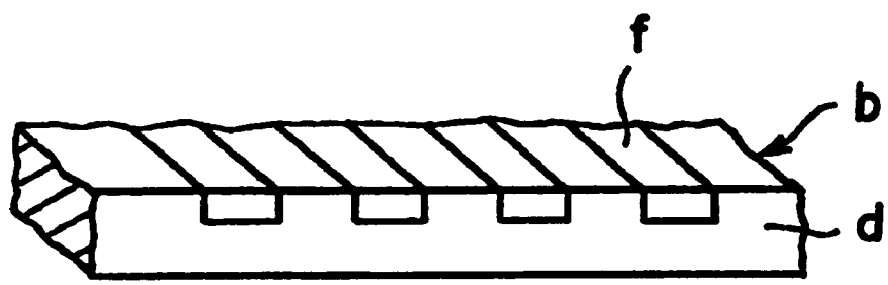
FIG. 9 is a perspective view of the pad portion of the conventional electronic control unit of FIG. 8.

The connector 3 in this embodiment is constituted by two molded parts 3A, 3B, the structures of which are shown in section with different hatching in FIG. 4. These parts 3A, 3B are produced in a two-stage molding process as illustrated in FIGS. 7(A) and 7(B). Referring to FIG. 7(A) in an initial stage, a strip-like terminal plate preform is formed from a wide width conductor plate with the tips of the 6 portions to be formed as the lead portions 42f being laterally connected. The preform is bent into a predetermined shape by press forming to provide a terminal plate. Four such terminal plates are stacked with portions forming the exposed surfaces 42a being aligned in a common plane as shown in FIG. 7(A). The laterally connected portions formed as the lead portions 42f and the portions formed as the pins 41 are supported at the center by holders 60, 61, set in a die, and embedded in resin while preventing positional displacement. As a result, a primary molded part 3A is produced, having the lead portions 42f and pins 41 projecting from its molded body (shown by the black area in the drawing). The primary molding provides only the pad portion 5 with a thick wall. An anchor portion 51 is formed for facilitating integration with the secondary molded part 3B. The remainder of the primary molded part 3A is formed with a minimum wall thickness which allows relative positioning of the terminal plates 4 except for a vertical beam reinforcing portion 3Aa for retaining the shape. In this state, bent portions 42b, 42c extending from the exposed surface 42a of the terminal plate 4 are not embedded in the resin material but, rather, are left exposed. The configuration of the primary molded part 3A is schematically shown in FIG. 5.

The thus obtained primary molded part 3A is formed such that only the surface of the pad portion 5 is exposed during the secondary molding of the connector 3 as shown in FIG. 6(B). As a result, the connector 3, having the bent portions 42b, 42c of the terminal plate 4 embedded in its resin, is obtained as shown in FIG. 4. During the secondary molding process, the anchor portion 51 becomes embedded in the resin material constituting the connector 3 so as to provide a secure connection of the primary molded part 3A with the secondary molded part 3B. When the secondary molding is completed, the connected portion 42f projects from the front face of the pad portion 5 of the secondary molded part. Accordingly, by cutting this projecting portion along the front face, each terminal plate 4 becomes an independent conductor. During the secondary molding, the primary molded part 3A swells with heating by the injected resin material which is at a high temperature, and shrinks with cooling upon completion of the processing. This swelling (expansion) and cooling may generate a very fine gap between the primary molded part 3A and the secondary molded part 3B. However, because the anchor resistance portion 51 serves to resist supersonic vibration applied to the wire 6 during bonding, slip between the primary molded part 3A and the secondary molded part 3B is minimized. As a result, during the wire bonding, sufficient supersonic vibration can be applied to the wire 6 to obtain good bonding.

According to the embodiments as described above in detail, each lead portion 42 has bent portions 42b, 42c which extend in opposite directions from the exposed surface portion 42a which is embedded in the pad portion 5 and which are embedded in the resin of the case 2. Each lead 42 of the terminal plate 4 is completely fixed to the case 2 at the pad portion 5. In addition, during wire bonding, the bent portion 42b serves to prevent vibration of the lead 42 with the wire 6, assuring firm bonding therebetween. Furthermore, because the lead 42 is fixed to the pad portion 5 by the second bent portion 42d formed by further bending the bent portion 42b, the lead 42 can be firmly fixed to the pad portion 5 of the case 2 not only in the axial direction but also in the direction perpendicular thereto. As a result, the lead 42 is prevented from separating from the pad portion 5 when lifting up the bonding tool. Furthermore, the anchor portion 51 to be embedded in the secondary molded part 3B is provided on the back surface of the pad portion 5 of the primary molded part 3A to resist transmission of the vibration to the open end side, thus making it possible to form a strong bond between the lead 42 and the wire 6 in the pad portion 5.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An electronic control unit comprising a circuit substrate, a casing housing the circuit substrate, a connector provided on the casing, and a plurality of terminal wires extending into the casing from pins within the connector and connecting to the circuit substrate, wherein said casing is provided with a pad portion for holding, spaced apart and embedded therein, lead portions of the terminal wires, each of the lead portions having an exposed surface at a surface of the pad portion, each exposed surface being connected to a terminal on the circuit substrate through a bonding wire, and said terminal wires further including first bent portions at opposing ends of each of said lead portions, said bent portions being embedded in the casing.

2. An electronic control unit according to claim 1, wherein each of said lead portions further has second bent portions extending from said first bent portions.

3. An electronic control unit according to claim 1 wherein the exposed surfaces of said lead portions are flat and are coplanar with said surface of said pad portion.

4. An electronic control unit comprising a circuit substrate, a casing housing the circuit substrate, a connector provided on the casing, and a plurality of terminal wires extending into the casing from pins within the connector to and connecting to the circuit substrate, wherein said casing is provided with a pad portion for holding, spaced apart and embedded therein, lead portions of the terminal wires, each of the lead portions having an exposed surface at one surface of the pad portion, each exposed surface being connected to a terminal on the circuit substrate through a bonding wire, and wherein the casing is formed of a primary molded part comprising the connector and the pad portion integrally molded together and a secondary molded part formed by casting around said primary molded part, said primary molded part having an integral anchoring member depending from a back surface, opposite said one surface, of the pad portion of the primary molded part and embedded in the secondary molded part.

5. An electronic control unit according to claim 4 wherein the exposed surfaces of said lead portions are flat and are coplanar with said surface of said pad portion.

6. An electronic control unit according to claim 4 wherein said anchoring member is an elongated member extending along an axis generally perpendicular to said back surface.

* * * * *